United States Patent

Eger

[15] 3,668,774

[45] June 13, 1972

[54] METHOD OF SEPARATING SEMICONDUCTOR CHIPS FROM A SEMICONDUCTOR SUBSTRATE

[72] Inventor: Helmut Eger, Olching, Germany

[73] Assignee: Siemens Aktiengesellschaft, Berlin, Germany

[22] Filed: Oct. 13, 1970

[21] Appl. No.: 80,400

[30] Foreign Application Priority Data

Oct. 16, 1969 Germany ....................... P 19 52 216.8

[52] U.S. Cl. ........................................ 29/578, 29/590, 29/580

[51] Int. Cl. ........................................ B01j 17/00, H01l 5/00

[58] Field of Search .................... 29/578, 580, 589, 590, 591, 29/583

[56] References Cited

UNITED STATES PATENTS 3,550,261 12/1970 Schroeder ................................ 29/589

3,590,478 7/1971 Takehana ................................ 29/578

*Primary Examiner*—John F. Campbell

*Assistant Examiner*—W. Tupman

*Attorney*—Curt M. Avery, Arthur E. Wilfond, Herbert L. Lerner and Daniel J. Tick

[57] ABSTRACT

A method of separating semiconductor chips from a semiconductor substrate, the semiconductor chips being arranged within the substrate and including circuit components with electrodes, interconnects or the like conductive members disposed on one side of the substrate, the method including the steps of coating the one side of the substrate with an etchable film that etches without attacking other materials arranged on the semiconductor substrate, forming contact holes through the film to expose the conductive members by photoresist and chemical etching, growing additional conductive members at the exposed first-mentioned conductive members, so that the additional conductive members partially cover the etchable film and extend over to neighboring semiconductor chips, etching away the etchable film so that the additional conductive members extending over to neighboring semiconductor chips are exposed, sticking the semiconductor substrate on to an elastic foil so that the one side thereof faces the latter, scoring the other side of the semiconductor substrate not facing the elastic foil so as to provide scribe lines outlining the semiconductor chips to be separated, breaking and stretching the semiconductor substrates adhering to the elastic foil, so that the semiconductor chips provided with the additional conductive members are separated from each other, and removing the individual semiconductors from the elastic foil.

9 Claims, 3 Drawing Figures

METHOD OF SEPARATING SEMICONDUCTOR CHIPS FROM A SEMICONDUCTOR SUBSTRATE

My invention relates to a method of separating semiconductor chips from a semiconductor substrate, the semiconductor chips comprising circuit components with electrodes, interconnects or the like conductive members.

Known methods provide for producing various circuit components or semiconductor chips from a semiconductor slice. In connection with these methods, a plurality of circuit elements are diffused into a semiconductor slice or are produced in the semiconductor slice with some other useable method. Subsequently, the contacts and the interconnects are applied to the individual circuit components.

The separation of the individual circuit components arranged on the slice is achieved by means of lapping, photoresist techniques and separating etching. This relatively expensive separation process is completely described, for example, in "The Western Electric Engineer," December 1967, page 14. Essential to this known method is the fact that the interconnects of an individual circuit component must be arranged on the same chip which is to be separated. It is therefore not possible, to permit the outer most free end of an interconnect of a first chip to run to a neighboring chip, and to divide the semiconductor slice so that the first chip is provided with this projecting interconnect so that the latter separates from the neighboring chip. This causes the space requirements of the circuit components or semiconductor chips arranged on a semiconductor slice to be large.

It is an object of my invention to provide a method of separating semiconductor chips arranged in a semiconductor substrate.

It is another object of my invention to provide a method of separating semiconductor chips arranged in a semiconductor substrate, whereby a saving of the space provided on the slice for the interconnects or beam leads or the like conductive members is realized.

According to a feature of my invention I achieve the foregoing objects by performing the following method steps in sequence: sticking the semiconductor substrate to a glass plate so that the other side thereof not provided with conductive members faces the glass plate, scoring the semiconductor substrate so as to provide scribe lines outlining in the semiconductor chips to be separated, coating the one side of the substrate whereat electrodes, interconnects or the like conductive members are disposed with an etchable film that etches without a concomitant etching of the other materials arranged on the semiconductor substrate, forming contact holes through the film to expose the conductive members by photoresist and chemical etching, growing additional conductive members at the exposed first-mentioned conductive members, so that the additional conductive members partially cover the etchable film and extend over to neighboring semiconductor chips, etching away the etchable film so that the additional conductive members extending over to the neighboring conductive chips are exposed, separating the semiconductor substrate from the glass plate and, sticking the substrate onto an elastic foil so that the other side thereof whereat no metal conductive members are disposed faces the latter, breaking and stretching the semiconductor substrate stuck to the elastic foil, so that the semiconductor chips provided with the additional conductive members are separated from each other, and removing the individual semiconductors from the elastic foil.

According to another feature of my invention, I provide a method of separating semiconductor chips from a semiconductor substrate which is a simplified procedure based on the method embodiment delineated above and involves the steps of coating the one side of the substrate whereat electrodes, interconnects or the like conductive members are disposed with an etchable film that etches without a concomitant etching of the other materials arranged on the semiconductor substrate, forming contact holes through the film to expose the conductive members by photoresist and chemical etching, growing additional conductive members at the exposed first-mentioned conductive member, so that the additional conductive members partially cover the etchable film and extend over to neighboring semiconductor chips, etching away the etchable films so that the additional conductive members extending over to the neighboring semiconductor chips are exposed, sticking the semiconductor substrate onto an elastic foil so that the one side thereof whereat no metal conductive members are disposed faces the latter, scoring the other side of the semiconductor not facing the elastic foil so as to provide scribe lines outlining semiconductor chips to be separated, breaking and stretching the semiconductor substrate stuck to the elastic foil, so that the semiconductor chips provided with the additional conductive members are separated from each other, and removing the individual semiconductors from the elastic foil.

Both of the above embodiments of the method of the invention permit a simple and proven scribing and breaking method to be applied to a semiconductor slice comprising circuit components having beam leads. Since with the method of the invention, interconnects or beam leads overhanging a chip extend over a neighboring chip, the instant invention affords the advantage that the space on the slice for accommodating these beam-leads in the known methods can be saved.

It is essential that the material used for the metal film be easily etchable. However, with this etching, the remaining materials present on the semiconductor substrate should not be affected. It has been shown to be preferable to use copper or nickel. These metals are easily etched, for example, with a nitricacid solution without the unwanted side effect that, for example, the gold-platinum-titanium interconnects are attacked.

Further details and features of the invention will become apparent from a description of the invention made with reference to the following drawings wherein.

Figure 1:
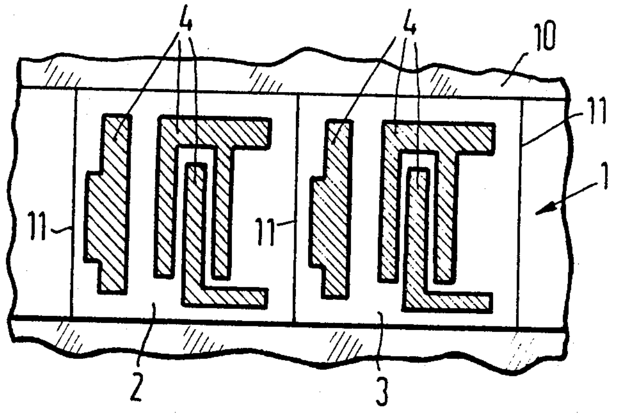
FIG. 1 illustrates a semiconductor substrate comprising chips or circuit components to be worked upon according to the method of the invention.

Referring to FIG. 1, the semiconductor substrate 1 comprises chips or circuit components 2, 3 and with metal electrodes 4. The substrate is positioned on a glass plate 10 so that the reverse side of the substrate whereat no metallic members are disposed, faces the glass plate. The semiconductor substrate is then scored with a diamond so that scribe lines are formed preparatory to the separation and breaking to be performed later. It is preferable to form the scribe lines beforehand.

Figure 2:
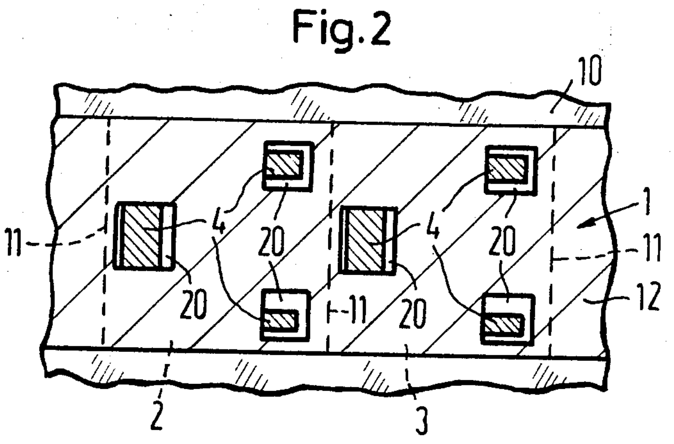
FIG. 2 illustrates the semiconductor substrate of FIG. 1 which is coated with a vapor-deposited copper film 12 according to a step of invention method.
Figure 3:
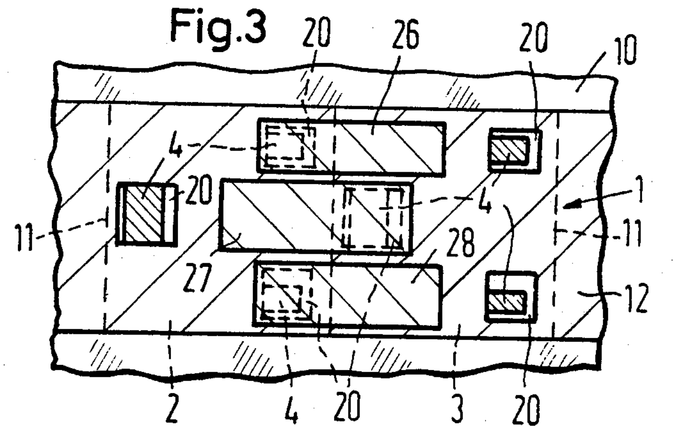
FIG. 3 illustrates the coated semiconductor substrate of FIG. 2 provided with additional inductive members.

Thereafter, as illustrated in FIG. 2, the semiconductor substrate is coated by vapor deposition with a copper film 12 of approximately 2 microns thick. The film 12 is vapor deposited on the side of the semiconductor substrate whereat the metal electrodes are provided. The copper film 12 is shown hatched in FIGS. 2 and 3 so that it may be more easily viewed. It has been shown that it is advantageous to use a nickel film in lieu of the copper film 12. By means of photoresist and chemical etching, the regions 20 of the electrodes or interconnects are etched so as to be exposed for facilitating the growing of additional conductive members 26, 27 and 28. After regions 20 are etched, the additional conductive members are grown galvanically and can consist for example of gold. The interconnects can for example be a composite layer comprising sequentially deposited layers of gold, platinum and titanium. The additional conductive members 26, 27 and 28 are shown hatched in FIG. 3. The subsequent photoresist for the beam-leads and the galvanic deposition are performed in accordance with known technique.

The copper film 12 on the semiconductor substrate is etched with a nitricacid solution. In this manner and referring to FIG. 3, the additional interconnect or conductive member 26 lose its mechanical support on the neighboring chip 3 and, likewise the additional interconnect 27 on the chip 2. All undesired electrical connections are thereby prevented. Thereafter, the semiconductor substrate is separated from the glass plate and is cemented by means of a cementing substance that is plastic and polymerizable to a high elastic foil. The foil can for example be made of rubber.

The already scored semiconductor substrate is then broken and stretched so that the individual circuit components or chips 2, 3 are separated from each other. For this purpose, the cementing substance must have a suitable plasticity. For facilitating further processing procedures, the stretched foil with the circuit components or chips separated from each other can be tensioned on a plate and the cementing substance hardened. Thermoplast has shown itself to be especially suitable for this purpose.

In another simpler embodiment of the invention, it is possible to omit sticking the semiconductor substrate onto a glass plate 10 for scoring the scribe lines. In lieu thereof, for separating the chips or circuit components, the semiconductor substrate is cemented to an elastic foil, so that the side thereof whereat the conductive members are disposed faces the foil; this step is performed before breaking and after the copper film is etched (without the glass plate 10 as in the first-mentioned embodiment). Thereafter, the substrate is placed in a suitable adjusting apparatus, preferably an infrared viewing apparatus, and etched on its reverse side. Thereafter the substrate is broken whereby the circuit components are separated from each other.

The invention makes it possible to substitute the simpler scribing and breaking method for the costly separation process that includes lapping, reverse-side photoresist techniques and separation etching and which has been applied up to the present time in the known methods of producing beam-lead integrated circuits.

A further advantage of the invention is that the overhanging additional interconnects or beam-leads extend over neighboring systems. In this way, the space provided for these beam-leads in the known methods is saved.

It will be obvious to those skilled in the art upon studying this disclosure that methods for separating semiconducted chips from a semiconductor substrate according to my invention permit of a great variety of modifications and hence can be given embodiments other that those particularly illustrated herein without departing from the essential features of my invention and within the scope of the claims annexed hereto.

I claim:

1. Method of separating semiconductor chips produced in a semiconductor substrate, the semiconductor chips being arranged within said substrate and comprising circuit components with electrodes, interconnects or the like conductive members disposed on one side of the substrate, the method comprising the steps of sticking the semiconductor substrate to a glass plate so that the other side thereof not provided with conductive members faces the glass plate, scoring said semiconductor substrate so as to provide scribe lines outlining the semiconductor chips to be separated, coating said one side of said substrate with an etchable film that etches without attacking the other materials arranged on the semiconductor substrate, forming contact holes through said film to expose said conductive members by photoresist and chemical etching, growing additional conductive members at the exposed first-mentioned conductive members, so that the additional conductive members partially cover the etchable film and extend over to neighboring semiconductor chips, etching away the etchable film so that the additional conductive members extending over to neighboring semiconductor chips are exposed, separating the semiconductor substrate from the glass plate, and sticking the substrate onto an elastic foil so that said other side thereof faces the latter, breaking and stretching said semiconductor substrate stuck to said elastic foil, so that the semiconductor chips provided with said additional conductive members are separated from each other, and removing the individual semiconductors from the elastic foil.

2. Method of separating semiconductor chips from a semiconductor substrate, the semiconductor chips being arranged within said substrate and comprising circuit components with electrodes, interconnects or the like conductive members disposed on one side of the substrate, the method comprising the steps of coating said one side of said substrate with an etchable film that etches without a concomitant etching of the other materials arranged on the semiconductor substrate, forming contact holes through said film to expose said conductive members by photoresist and chemical etching, growing additional conductive members at the exposed first-mentioned conductive members, so that the additional conductive members partially cover the etchable film and extend over to neighboring semiconductor chips, etching away the etchable film so that the additional conductive members extending over to neighboring semiconductor chips are exposed, sticking said semiconductor substrate onto an elastic foil so that said one side thereof faces the latter, scoring the other side of said semiconductor substrate not facing said elastic foil so as to provide scribe lines outlining the semiconductor chips to be separated, breaking and stretching said semiconductor substrate stuck to said elastic foil, so that the semiconductor chips provided with said additional conductive members are separated from each other, and removing the additional semiconductors from the elastic foil.

3. A method according to claim 2 wherein the etchable film is a copper film.

4. A method according to claim 3 wherein the copper film is 2 microns thick.

5. A method according to claim 2 wherein the etchable film is a nickel film.

6. A method according to claim 5 wherein the nickel film is 2 microns thick.

7. A method according to claim 2 wherein the elastic foil is made of rubber.

8. A method according to claim 2 wherein the semiconductor substrate is stuck to the foil with a plastic, polymerizable cementing substance.

9. A method according to claim 2 wherein said scribe lines are made in an adjusting apparatus, said apparatus being an infrared viewing apparatus.

* * * * *